US010665744B2

(12) United States Patent
Bitnar et al.

(10) Patent No.: US 10,665,744 B2
(45) Date of Patent: May 26, 2020

(54) BIFACIAL PHOTOVOLTAIC MODULE

(71) Applicant: SolarWorld Innovations GmbH, Freiberg (DE)

(72) Inventors: Bernd Bitnar, Bannewitz (DE); Alexander Fuelle, Wilkau-Hasslau (DE); Martin Kutzer, Penig (DE); Frank Wecke, Dresden (DE)

(73) Assignee: SOLARWORLD INDUSTRIES GMBH, Bonn (DE)

( * ) Notice: Subject to any disclaimer, the term of this patent is extended or adjusted under 35 U.S.C. 154(b) by 717 days.

(21) Appl. No.: 15/098,346

(22) Filed: Apr. 14, 2016

(65) Prior Publication Data
US 2017/0162737 A1 Jun. 8, 2017

(51) Int. Cl.
*H01L 31/05* (2014.01)
*H01L 31/02* (2006.01)
*H01L 31/0224* (2006.01)
*H01L 31/068* (2012.01)

(52) U.S. Cl.
CPC ...... *H01L 31/0516* (2013.01); *H01L 31/0201* (2013.01); *H01L 31/022441* (2013.01); *H01L 31/0684* (2013.01); *Y02E 10/50* (2013.01)

(58) Field of Classification Search
CPC ......... H01L 31/022441; H01L 31/0201; H01L 31/0516; H01L 31/0684
See application file for complete search history.

(56) References Cited

U.S. PATENT DOCUMENTS

| | | | | | |
|---|---|---|---|---|---|
| 5,391,235 | A | * | 2/1995 | Inoue | H01L 31/03921 136/244 |
| 5,951,786 | A | * | 9/1999 | Gee | B32B 17/10018 136/256 |
| 2004/0200522 | A1 | * | 10/2004 | Fukawa | H01L 31/022425 136/259 |
| 2009/0126788 | A1 | * | 5/2009 | Hishida | H01L 31/022458 136/256 |
| 2009/0223562 | A1 | * | 9/2009 | Niira | H01L 31/1804 136/256 |

(Continued)

FOREIGN PATENT DOCUMENTS

| | | |
|---|---|---|
| DE | 102010016675 A1 | 11/2011 |
| DE | 202015102238 U1 | 6/2015 |

(Continued)

*Primary Examiner* — Golam Mowla
(74) *Attorney, Agent, or Firm* — Viering, Jentschura & Partner MBB

(57) ABSTRACT

A bifacial photovoltaic module with at least one bifacial solar cell is provided. The at least one bifacial solar cell includes a substrate with a front-side and a rear-side. The front-side is the light incident side and the rear-side has rear-side contact structure. The rear-side contact structure includes a plurality of electrically conductive contact fingers, which have a first metal, a plurality of solder pads electrically connected to the contact fingers. The solder pads have a top. The solder pads have a second metal, which is different from the first metal. The rear-side contact structure further includes several cell connectors electrically connected to the solder pads. The top of the solder pads is free from the contact fingers in an area along one direction. The cell connectors are disposed planar on or above this area.

17 Claims, 4 Drawing Sheets

(56) References Cited

U.S. PATENT DOCUMENTS

| | | | |
|---|---|---|---|
| 2009/0272419 A1* | 11/2009 | Sakamoto | H01L 31/02168 136/244 |
| 2010/0243024 A1* | 9/2010 | Hashimoto | H01L 31/0201 136/244 |
| 2010/0263718 A1* | 10/2010 | Abiko | H01L 31/022441 136/252 |
| 2011/0132423 A1* | 6/2011 | Joge | H01L 31/18 136/244 |
| 2011/0265844 A1 | 11/2011 | Storbeck et al. | |
| 2013/0152994 A1 | 6/2013 | Schaarschmidt et al. | |
| 2013/0183789 A1 | 7/2013 | Schaarschmidt et al. | |

FOREIGN PATENT DOCUMENTS

| | | |
|---|---|---|
| DE | 202015103803 U1 | 8/2015 |
| WO | 2011147388 A1 | 12/2011 |

* cited by examiner

BIFACIAL PHOTOVOLTAIC MODULE

CROSS-REFERENCE TO RELATED APPLICATION

This application claims priority to German Patent Application Serial No. 20 2015 106 557.4, which was filed Dec. 2, 2015, and is incorporated herein by reference in its entirety.

TECHNICAL FIELD

Various embodiments relate generally to a bifacial photovoltaic module.

BACKGROUND

In a conventional bifacial photovoltaic module, a rear-side contact structure 100 (FIG. 1) with Silver solder pads 106 is provided on the rear-side of a substrate 102 for electrically contacting the photovoltaic module. Furthermore, Aluminum contact fingers 104 are provided for collecting the photovoltaic current generated by the photovoltaic module. The Silver solder pads 106 have a lower thickness than the Aluminum contact fingers 104. The contact fingers 104 are configured partially overlapping on the solder pads in order to electrically interconnect these. By this overlapping, an Aluminum bead 108 is configured on the solder pads 106.

Cell connectors 110 are electrically connected to the solder pads 106 in order to electrically interconnect several photovoltaic modules. For this purpose, the cell connectors 110 are soldered on the solder pads 106. For this, it is necessary that a soldered cell connector 110 is bent for soldering on a Silver solder pad 106 over the Aluminum bead 108 in order to be able to contact the Silver surface of the solder pads 106.

In very small solder pads 106, the cell connector 110 cannot be sufficiently bent, so that in this case there is no solder contact. Moreover, the cell connectors 110 are mechanically stressed in the region of the bead 108, which can lead to the breaking of the cell connectors 110. The problem is aggravated if the bead 108 is reinforced in the border region of both structures by an overlap of Silver and Aluminum layers. Therefore, thin cell connectors 110, such as they are used in the so-called Smart-Wire process, cannot be used with a conventional rear-side contact structure so far used or used only with great difficulty.

SUMMARY

A bifacial photovoltaic module with at least one bifacial solar cell is provided. The at least one bifacial solar cell includes a substrate with a front-side and a rear-side. The front-side is the light incident side and the rear-side has rear-side contact structure. The rear-side contact structure includes a plurality of electrically conductive contact fingers, which have a first metal, a plurality of solder pads electrically connected to the contact fingers. The solder pads have a top. The solder pads have a second metal, which is different from the first metal. The rear-side contact structure further includes several cell connectors electrically connected to the solder pads. The top of the solder pads is free from the contact fingers in an area along one direction. The cell connectors are disposed planar on or above this area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
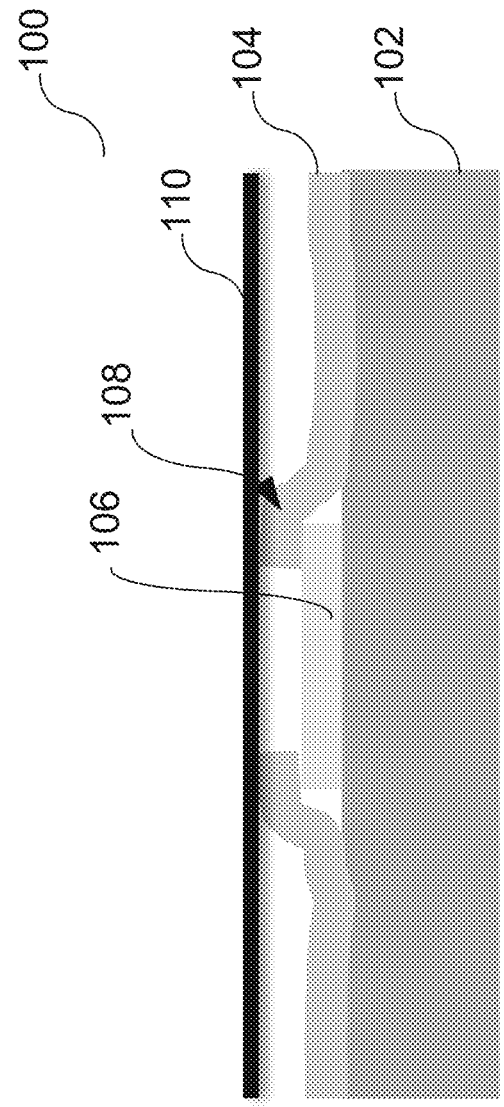
FIG. 1 shows a schematic cross-sectional view of a rear-side contact structure of a conventional bifacial photovoltaic module.

The following detailed description refers to the accompanying drawings that show, by way of illustration, specific details and embodiments in which the invention may be practiced.

In the following detailed description, reference is made to the accompanying drawings, which form the part of this and in which are shown for illustration, specific embodiments in which the invention can be exercised. In this respect, the directional terminology such as "above", "below/under", "in front", "behind", "forward", "rearward", etc. are used with reference to the orientation of the described figure(s). Since components of embodiments can be positioned in a number of different orientations, the directional terminology is only for illustration and is not limiting in any way. It should be noted that other embodiments can be used and structural or logical modifications can be undertaken without departing from the scope of protection of the present invention. It should be noted that the features of the various embodiments described herein can be combined with each other, unless not specifically stated otherwise. Therefore, the following detailed description is not to be understood in a restrictive sense, and the scope of protection of the present invention is defined by the accompanying claims.

Within the scope of this description, the terms "joined", "connected" and "coupled" are used for describing a direct as well as an indirect joint, a direct or indirect connection and a direct or indirect coupling. In the figures, identical or similar elements are provided with identical reference numerals, where appropriate.

In various embodiments, a photovoltaic module is defined as a device, which converts the radiation energy of predominantly visible light (for example at least a part of the light in the visible wavelength range of approximately 300 nm to approximately 1150 nm; it should be noted that additionally, ultraviolet (UV) radiation and/or infrared (IR) radiation can also be converted), for example of sunlight, directly into electric energy by means of the so-called photovoltaic effect. The device can be electrically connectable to several solar cells (which are interconnected in series and/or in parallel), and optionally with a weather protection (for example, glass), an embedding and a frame.

Various embodiments provide a bifacial photovoltaic module, which is mechanically stable. Furthermore, an adhesive solder joint is enabled in bifacial photovoltaic modules with very small silver solder pads, for example for cell connectors of the Smart-Wire process.

Various embodiments provide a bifacial photovoltaic module consisting of bifacial solar cells. Each bifacial solar cell has a substrate with a front-side and a rear-side. The front-side is the light incident side and the rear-side has a rear-side contact structure. The rear-side contact structure has a plurality of electrically conductive contact fingers, which have a first metal. The rear-side contact structure also has a plurality of solder pads electrically connected to the contact fingers, wherein the solder pads have a top. The solder pads have a second metal, which is different from the first metal. The rear-side contact structure also has several cell connectors electrically connected to the solder pads. The top of the solder pads is free from the contact fingers in an area along a direction. The cell connectors are disposed planar on or above this area.

This enables an essentially stress-free arrangement and soldering of the cell connectors with the solder pads, since the cell connectors are not bent over a conventionally configured bead of the contact fingers. Thus, contact fingers can be disposed on top of the solder pads next to the area along the direction, on or above which a cell connector is disposed, for example on one side of the cell connector or on both sides of the cell connector, for example bordering or channelled on both sides. As such, the contact fingers can act on top of the solder pads as limiting stop or positioning aid for the cell connectors. Moreover, the solder by which the cell connector is connected to the solder pad, can have the first metal and/or the second metal.

In various configurations, the contact fingers are disposed substantially perpendicular to the cell connectors. This enables an efficient current collection from the surface of the photovoltaic module, since the length of the current transport route is minimized by the perpendicular arrangement.

In various configurations, the rear-side contact structure in addition has several busbars electrically connected to the contact fingers. This enables an efficient current collection from the surface of the photovoltaic module, since busbars generally have a lower electrical resistance than the contact fingers. Furthermore, busbars enable a cross-linking of contact fingers, for example for example in case where the direct electrical connection of a contact finger to a solder pad is interrupted, for example by means of a mechanical fracture.

If the rear-side contact structure has a higher number of cell connectors, the busbars or a part of the busbars can be optional. Thus, the clouding or shading effect can be reduced.

In various configurations, the busbars have the first metal. This enables the manufacture of busbars and the contact fingers in a single process, for example a single screen-printing process. This can also ensure a reliable electrical connection between busbars and contact fingers.

In various configurations, the busbars are disposed substantially parallel to the cell connectors. In this case, parallel is to be understood as parallel and at a distance, in other words, as parallel offset at a distance from each other. This enables an efficient current collection from the surface of the photovoltaic module, since the electrical resistance of the current transport route through the busbars is reduced. Moreover, this prevents to dispose a Busbar in the region between the cell connector and the rear-side.

In various configurations, at least one cell connector is disposed between two busbars. This enables to reduce the number of solder pads of the rear-side contact structure, since the cell connector can collect the current of the adjacent busbars.

In various configurations, a busbar is disposed exactly in the middle between two cell connectors. This enables a uniform loading of the cell connectors.

In various configurations, the cell connectors electrically interconnect several solder pads. This enables an interconnection of individual current collection areas, whereby the number of solder pads can be reduced.

In various configurations, at least one contact finger is disposed between two solder pads. This enables simple cross-linking of the current collection areas of the photovoltaic module. Therefore, the contact finger can be disposed under a cell connector between the solder pads. Alternatively, the contact finger is disposed adjacent the cell connectors, which are disposed on the solder pads, between which the contact finger is disposed. In this case, the cell connector can electrically interconnect the solder pads. Moreover, the contact fingers can partially overlap the solder pads.

In various configurations, the area between the cell connectors and the rear-side is free from contact fingers. This may prevent the development of an area of mechanical stress under the cell connectors.

In various configurations, the area between the cell connectors and the rear-side is free from busbars. This prevents development of area of mechanical stress under the cell connector.

In various configurations, the contact fingers are electrically connected to at least one solder pad and/or with at least one busbar. This easily enables a cross-linking of the current collecting areas of the photovoltaic module.

In various configurations, at least a part of the solder pads is laterally connected to the contact fingers or disposed on or under the contact fingers. This easily enables an electrical connection of the contact finger with the solder pads.

In various configurations, the cell connectors are configured as a wire and/or a strip. This easily enables an electrical contacting of the photovoltaic module.

In various configurations, the solder pads are disposed in rows and rows, wherein the arrangement is such that solder pads of adjacent rows are respectively disposed offset about a line. This enables a denser packing of the cell connectors, so that busbars are optional for example, and prevents the solder pads of the adjacent rows to form a busbar.

Figure 2:
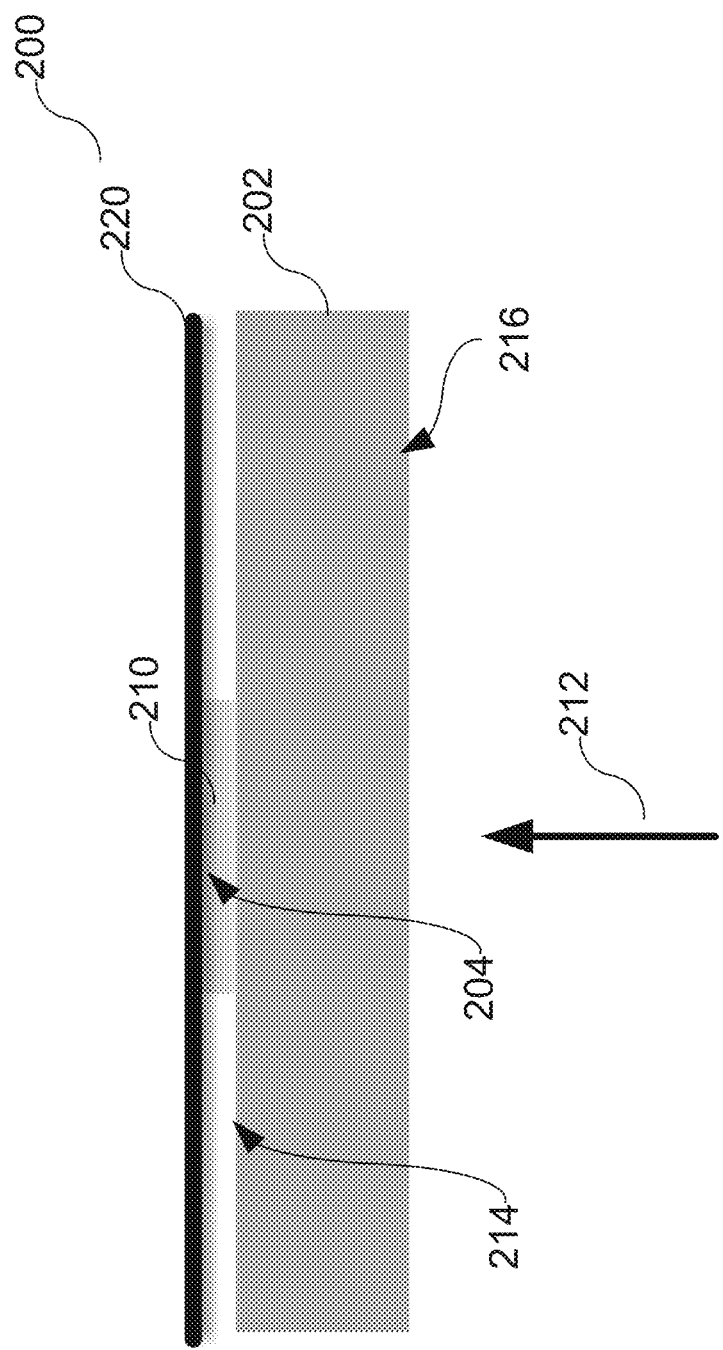
FIG. 2 shows a schematic cross-sectional view of a rear-side contact structure of a bifacial photovoltaic module according to various embodiments.

FIG. 2 shows a schematic cross-sectional view of a rear-side contact structure 200 of a photovoltaic module according to various embodiments, for example a bifacial photovoltaic module.

In various embodiments, a photovoltaic module, for example a bifacial photovoltaic module has several solar cells, for example bifacial solar cells. Each bifacial solar cell has a substrate 202 with a front-side 216 and a rear-side 214.

The front-side 216 is the light incident side. In other words: the front-side 216 is the light source and faces the incident light (illustrated by means of arrow 212 in FIG. 2). The substrate 202 can have a front-side contact structure on or above the front-side 216. In addition, the emitter layer or the emitter region, for example a main doped region, for example a region with higher dopant concentration is disposed on the front-side 216, as described in greater detail below.

The rear-side 214 is opposite the front-side 216. In other words: the rear-side 214 is the side turned away from the light source and the incident light. The rear-side 214 has a rear-side contact structure 200. In other words: a rear-side contact structure 200 is configured or provided on the rear-side 214 of the substrate 202. In addition, the rear-side field (back surface field—BSF) is disposed on the rear-side 214. Reflected or received back light (Albedo) can fall on the rear-side 214

Figure 3:
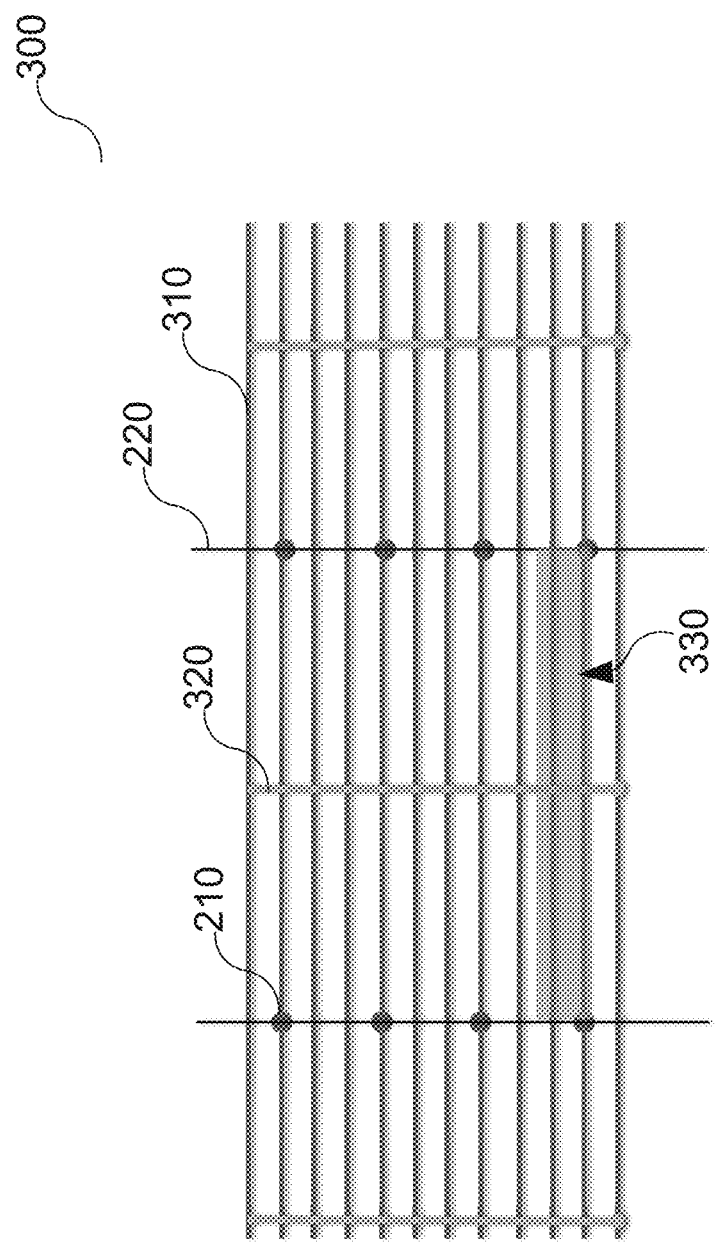
FIG. 3 shows a schematic top-view of a rear-side contact structure of a bifacial photovoltaic module according to various embodiments.

The rear-side contact structure 200 has several electrically conductive contact fingers (see also FIG. 3). The contact fingers have a first metal.

Furthermore, the rear-side contact structure 200 has a plurality of solder pads 210 electrically connected to the contact fingers. The solder pads 210 have a top 204. The solder pads 210 have a second metal, which is different from the first metal.

Furthermore, the rear-side contact structure 200 has several cell connectors 220 electrically connected to the solder pads 210. The top 204 of the solder pads 210 is free from the contact fingers in the area along one direction. The cell connectors 220 are disposed planar or substantially planar on or above this area. Therefore, a high deflection of the cell connectors 220 can be prevented.

In other words, the cell connectors 220 are flat or substantially flat on the solder pads 210 and thus are not bent over a metallizing bead (see also FIG. 1) as is conventionally. The cell connector 220 can be firmly, i.e. firmly bonded, soldered or glued on the solder pads 210. In addition, the cell connectors 220 can be disposed mechanically slackened on or above the solder pads 210.

The substrate 202 can have or consist of at least one photovoltaic layer. Alternatively, at least one photovoltaic layer can be disposed on or above the substrate 202. The photovoltaic layer can have or consist of semiconductor material (such as Silicon), a compound semiconductor material (such as a III-V-compound semiconductor material (such as GaAs), a II-VI-compound semiconductor material (such as CdTe), a compound semiconductor material such as Copper-Indium-Diselenide. As another alternative, the photovoltaic layer can have organic material or consist thereof. In various embodiments, the Silicon can have or consist of monocrystalline Silicon, polycrystalline Silicon, amorphous Silicon, and/or microcrystalline Silicon. In various embodiments, the photovoltaic layer can have or consist of a semiconductor junction structure such as a pn-junction structure, a pin-junction structure, a Schottky-type junction structure, and the like. The substrate 202 and/or the photovoltaic layer can be provided with a base doping of a first type of conductor.

In various embodiments, the base doping in the substrate 202 can have a doping concentration (for example a doping of the first type of conductor, for example a doping of the p-type of conductor, for example with dopant of the III$^{rd}$ main group of the periodic system, for example a doping with Boron (B)) in a range of approximately $10^{13}$ cm$^{-3}$ to $10^{18}$ cm$^{-3}$, for example in a range of approximately $10^{14}$ cm$^{-3}$ to $10^{17}$ cm$^{-3}$, for example in a range of approximately $10^{15}$ cm$^{-3}$ to $2*10^{16}$ cm$^{-3}$. The area provided with the base doping is also referred to in the following as base area. In various embodiments, the base area is electrically connected, in other words, contacted to one or more solder pads 210.

In various embodiments, an emitter region doped with dopant of a second type of conductor, can be formed in the substrate 202. The second type of conductor is opposite the first type of conductor, for example with dopant of n-type of conductor, for example with dopant of the Vth main group of the periodic system, for example with Phosphorous (P). In various embodiments, the emitter region is likewise electrically connected, in other words, contacted to one or more solder pads 210.

In various embodiments, the layer resistance in the emitter region is in a range of approximately 60 Ohm/sq to approximately 300 Ohm/sq, for example in a range of approximately 70 Ohm/sq to approximately 200 Ohm/sq, for example in a range of approximately 80 Ohm/sq to approximately 120 Ohm/sq.

The substrate 202 can be made of a solar cell wafer and can have for example a round shape such as a circular shape or an elliptical shape or a polygonal shape such as a square shape. In various embodiments, the solar cells of the solar cell module, however also have a non-square shape. In these cases, the solar cells of the solar cell module can be formed, for example by separating (for example cutting) and thus, parting of one or more (also referred to in their shape as standard solar cell) solar cell(s) into several non-square or square solar cells. In various embodiments, it can be provided in these cases to carry out adaptations of the contact structures in the standard solar cell, for example rear-side cross-structures can be additionally provided.

In various embodiments, the photovoltaic module or a solar cell thereof can have the following dimensions: a width in a range of approximately 5 cm to approximately 50 cm, a length in a range of approximately 5 cm to approximately 50 cm, and a thickness in a range of approximately 100 μm to approximately 300 μm.

FIG. 3 shows a schematic top-view of a rear-side contact structure of a bifacial photovoltaic module according to various embodiments. The photovoltaic module according to FIG. 3 is similar to the photovoltaic module according to FIG. 2, which is why for avoiding repetition; a reference is made to the description of the features of the photovoltaic module according to FIG. 2, which likewise applies for the photovoltaic module according to FIG. 3 except for the differences explained in the following.

In FIG. 3, the several contact fingers 310 of the rear-side contact structure 300, already described above, are apparent. Thus, in various embodiments, the rear-side contact structure 300 has parallel running contact fingers 310 and solder pads 210.

In various configurations, the rear-side contact structure 300 also has several busbars 320. The layout illustrated in FIG. 3, of a metallization of a rear-side contact structure 300 of a bifacial photovoltaic module is configured, for example for a Smart-Wire circuit.

In various embodiments, the solder pads 210 may include or essentially consist of, for example Silver, Copper, Aluminum, Nickel, Cobalt, Zinc, Titanium, Palladium, Tantalum, Gold, Platinum or any combination or alloy of these materials.

In various embodiments, the solder pads 210 may include or essentially consist of a stack of different metals, for example Nickel on Titanium, Silver on Titanium, Silver on Nickel or for example, a stack of layer formed of Titanium-Palladium-Silver, or a stack of Titanium or Nickel (both act as diffusion barrier in this case) with Copper disposed thereon.

In various configurations, the second metal is Silver or a Silver alloy. The solder pads are, for example made of Silver and configured on some of the contact fingers 310. The solder pads 210 are configured, for example from screen-printed Silver.

In various configurations, the solder pads 210 are disposed in columns and rows. The arrangement of the solder pads can be such that solder pads 210 of adjacent columns are disposed respectively offset about at least one row or respectively in the same row. For example, the solder pads 210 of adjacent columns are offset about a row, about two rows, about three rows or more rows.

In various configurations, the solder pads 210 have a length in a range of approximately 1 mm to approximately 5 mm, a width in a range of approximately 1 mm to approximately 3 mm and a thickness in a range of approximately 0.002 mm to approximately 0.01 mm.

For a sufficient adhesion of the solder contacts in the Smart-Wire circuit, a minimum area of the solder pad 210 is necessary, which is distinctly greater than the contact area of the cell connector 220 in the form of a wire on a contact finger 310.

For example, the size of the solder pad 210 is 1.5×1.5 mm$^2$. For example, six solder pads 210 per busbar 320 are used. The solder pads 210 would overlap the continuous busbars at a distance of the contact finger 310 on the rear-side of the bifacial photovoltaic module of approximately 1 mm. Thereby the consumption of Silver would increase impermissibly high. Therefore, the solder pads 210 should not be printed on each contact finger 310, but respectively disposed offset in at least one row, for example exactly in one row, i.e. one contact finger 310.

In various configurations, the contact finger 310 are disposed substantially perpendicular to the cell connectors 220. Alternatively, the contact fingers 310 are disposed at an angle with respect to at least one cell connector 220. In various configurations, the contact fingers 310 are disposed substantially strip shaped and transverse to the cell connectors 220. In various configurations, at least one contact finger 310 is disposed between two solder pads 210.

In various configurations, at least one part of the solder pad 210 is laterally connected to the contact fingers 310 or is disposed on or under the contact fingers 310.

In various configurations, the contact fingers 310 respectively have a length in a range of approximately 5 mm to approximately 156 mm, a width in a range of approximately 0.080 mm to approximately 0.400 mm and a thickness in a range of approximately 0.01 mm to approximately 0.05 mm.

In various configurations, the first metal has one of the following metals or a metal alloy thereof: Aluminum, Copper, Nickel. The contact fingers 310 are configured, for example from a screen-printed Aluminum.

In various configurations, the rear-side contact structure 300 in addition has several busbars 320 electrically connected to the contact fingers 310. In various embodiments, the busbars 320 are configured perpendicular or substantially perpendicular to the contact fingers 310. The busbars 320 electrically interconnect, i.e. intercouple the contact fingers 310. In various configurations, the contact fingers 310 are electrically connected to at least one solder pad 210 and/or to at least one busbar 320. In the example shown, the busbars 320 run in the middle between two cell connectors 220.

In the described layout, only one busbar per cell connector is required, i.e. the shadowing effect is reduced. The reduction of the shadowing effect for an assumed width of the busbars of 300 µm and a reduction in the number of the busbars from current 24 to 13 is approximately 2% of the cell area. In the example in FIG. 3, one busbar is shown respectively between two cell connectors 220. But, it is also possible to arrange a higher number of busbars 320 between the cell connectors 220. In various embodiments, a layout can be conceived, in which, a busbar each runs on each side of the cell connector 220 or wire.

The busbars 320 are formed, for example from screen-printed Aluminum or screen-printed Silver. Alternatively, the busbars 320 can be configured as highly doped regions in the semiconductor. In other words: The busbars 320 are not metallized.

In various configurations, the busbars 320 have the first metal or are formed thereof. The busbars 320 can be formed, for example as the contact fingers of Aluminum. Therefore, the busbars 320 can also be referred to as Aluminum redundancy lines. For example, the busbars 320 are configured by means of a screen-printing of an Aluminum paste and a subsequent addition of Aluminum by a firing step.

In various configurations, the busbars 320 respectively have a length in a range of approximately 30 mm to approximately 156 mm, a width in a range of approximately 0.08 mm to approximately 2 mm and a thickness in a range of approximately 0.01 mm to approximately 0.2 mm.

In various embodiments, the several cell connectors 220 are disposed adjacent each other, for example implemented as contact wires (also referred to as solar cell connecting wires) and/or contact strips (also referred to as solar cell connector tapes). The cell connectors 220 are equipped for collecting and transferring electrical energy, which has been generated by the photovoltaic layer of a respective solar cell. The cell connectors 220 are, for example wires of the Smart-Wire process or conventional cell connector. The cell connectors 200 are soldered on the solder pads 210.

In various configurations, at least one cell connector 220 is disposed between two busbars 320. In various configurations, a busbar is disposed exactly in the middle between two cell connectors 220. In various configurations, the cell connectors 220 electrically interconnect several solder pads 210.

The cell connectors 220 can have or consist of electrically conductive material, for example metallic conductive material. In various embodiments, the cell connectors 220 can have or consist of one or more metallic materials, for example made of one or more of the following metals: Cu, Al, Au, Pt, Ag, Pb, Sn, Fe, Ni, Co, Zn, Ti, Mo, W, and/or Bi. In various embodiments, the cell connectors 220 may include or essentially consist of one metal, selected from a group consisting of: Cu, Au, Ag, Pb, and Sn. In various embodiments, the cell connectors 220 can basically have any cross-sectional shape such as a round (for example circular) shape, an oval shape, a triangular shape, a rectangular shape (for example a square shape), or any other suitable polygonal shape. In various embodiments, the cell connectors 220 can have a metal, for example Nickel, Copper, Aluminum and/or Silver or another suitable metal or a metal alloy, for example brass. Furthermore, the cell connectors 220 can be coated with a metal or a metal alloy, for example with Silver, Sn and/or Nickel and/or a brazing coating, having or consisting of, for example Sn, SnPb, SnCu, SnCuAg, SnPbAg, SnBi. In various embodiments, one more cell connector 220 can be provided in a respective rear-side contact structure, for example a number in the range of approximately 5 to approximately 60, for example in a range of approximately 10 to approximately 50, for example in a range of approximately 20 to approximately 40, for example approximately 30. In various embodiments, the cell connectors 220 of the prefabricated rear-side contact structure with the metallizing structures, for example the solder pads 210 are soldered in a process carried out subsequently. In order to improve the bonding of the binding of the cell connectors 220 to the metallizing structures, the latter are pre-soldered, for example by a wave soldering process.

In various embodiments, in the Smart-Wire layout, the rear-side contact structure 300 has a plurality of electrically non-conductive and, for example flat elements insulated from each other, on which, the cell connectors 220 are disposed, for example glued. In various embodiments, thus the cell connectors 220 are, for example adhesively connected to the flat elements. In various embodiments, thus the electrically non-conductive flat elements can be formed, for example from a continuous element, for example a continuous adhesive film, which can be provided obviously, for example from a roll in the form of an "endless strip". The electrically non-conductive flat elements can be, for example perforated, or also interconnected only in individual partial areas, for example by means of connection bridges.

In various embodiments, obviously a plurality of substantially parallel cell connectors 220 (for example in the form of contact wires (also referred to as connecting wires) 220 or contact tapes (also referred to as connecting tapes) 220—in the following also referred to as connecting field—are respectively glued to a self-adhesive plastic film. This can be done on both sides or on one side. The application of a first adhesive film and optionally a second adhesive film can be done simultaneously or in two steps. Obviously, in various embodiments, a strip-like rear-side contact structure is designed such that a plurality of substantially parallel running cell connectors 220 (tape or wire) are fixed, for example by glued plastic films (generally by electrically non-conductive flat elements).

In various configurations, the contact fingers 310 under the cell connectors 220 can be continuous or also interrupted. In various configurations, the area between the cell connectors 220 and the rear-side is free from contact fingers 310.

In various configurations, the area between the cell connectors 220 and the rear-side is free from busbars 320. The area under the cell connectors 220 is free from busbars 320. The busbars 320 are displaced parallel to the cell connectors 220. Thus, the busbars 320 are decoupled from the solder pads.

In various embodiments, the area under the cell connectors 220, i.e. the areas between the cell connectors 220 and the rear-side of the substrate 202, which runs perpendicular to the contact fingers 310, is free, for example free from metal.

In various configurations, the area between the cell connectors 220 and the rear-side have a third material. The third material can be different from the first metal and the second metal. The third material can be, for example a dielectric, for example a plastic, a resin or the like. The third material can be, for example a non-conducting supporting structure for the cell connector. Alternatively or additionally, the third material can be a film, on which the cell connectors are disposed.

In various configurations, at least twice, e.g. at least thrice more contact fingers 310 are provided than the solder pads 210 per cell connector 220.

In various configurations, the busbars 320 are respectively configured such that they have a lower electric resistance than an individual contact finger 310.

In various configurations, the busbars 320 are respectively configured such that they have the same electric resistance as an individual contact finger 310.

Furthermore, in FIG. 3a is illustrated a current collecting area 330 for the current which flows through a contiguous contact finger in a solder pad 210. In the layout shown in FIG. 3 and under the assumption of typically 12 solder pads 210 per 156 mm length and 13 busbars 320, a width of the busbars 320 of less than 100 µm is enough in order to have a sufficient cross-conductivity. So that, the busbars 320 can have the normal width of the contact fingers 310 and contribute very little for clouding or shading effect.

Estimation of the permissible busbar width:

As a prerequisite, it is assumed that the power loss of the Smart-Wire layout $P_{SW}$ may not exceed that of a 5-busbar layout $P_{5Busbar}$ with 3 mm width busbars 320.

For a distance of the cell connectors 220 of about 12 mm and a distance of the solder pads 210 of about 15 mm, the area of the region 330, the generated current of which is dissipated through the busbar, is 90 mm². With an assumed Jsc=44 mA/cm² for a bifacial operated solar cell, the current is about 40 mA.

In the 5-busbar layout with 6 solder pads, the collecting area is 25*32 mm²=800 mm². Then, the current is 350 mA.

If the power loss:

$$P=I^2*R=I^2*r_{Al}*l/(h*b)$$

of both configurations should be the same (it means: I: Current, R: Resistance, $r_{Al}$: specific resistance of the Aluminum busbar, l: Length, b: Width, h: Height of the busbar), i.e.

$$P_{5Busbar}=P_{SW}$$

the width of the busbars 320 for the Smart-Wire layout results in $b_{SW}$ $$b_{SW}=I_{SW}^2/I_{5Busbar}^2*b_{5busbar}=40 \mu m<100 \mu m.$$

So that, 100 µm busbar width still results in a smaller series resistance than the 3 mm width busbars 320 of the 5-busbar layout.

Figure 4:
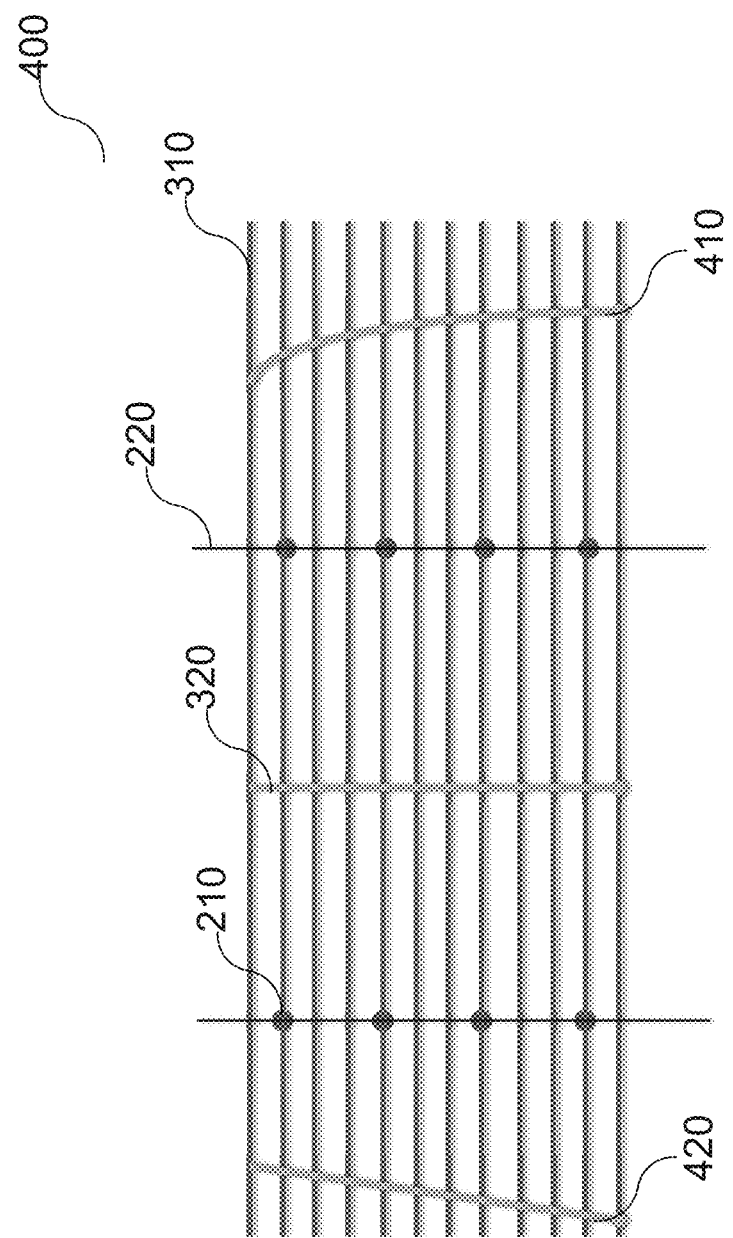
FIG. 4 shows a schematic top-view of a rear-side contact structure of a bifacial photovoltaic module according to various embodiments.

FIG. 4 shows a schematic top-view of a rear-side contact structure of a bifacial photovoltaic module according to various embodiments. The photovoltaic module according to FIG. 4 is similar to the photovoltaic module according to FIG. 2 and FIG. 3, which is why for avoiding repetitions, a reference is made to the description of the features of the photovoltaic module according to FIG. 2 and FIG. 3, which similarly applies for the photovoltaic module according to FIG. 4 except for the differences explained in the following.

In various configurations, the busbars 320 are disposed substantially parallel to the cell connectors 220. Alternatively, the busbars 320 are disposed inclined to a cell connector 220. Alternatively or additionally, the busbars 320 have a curvature or a bend, for example an arched shape in their longitudinal direction.

In other words: In various embodiments, the rear-side contact structure 400 has at least one or more busbars 320, 410, 420, wherein one or more of the busbars have a curvature or a bend along their longitudinal direction (illustrated as an example of a curved busbars 410). Alternatively or additionally, one or more busbars can be disposed at an angle, i.e. inclined to at least one cell connector (illustrated as an example of the cell connectors 420 running inclined).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A bifacial photovoltaic module with at least one bifacial solar cell, the at least one bifacial solar cell comprising:
a substrate with a front-side and a rear-side;
wherein the front-side is the light incident side and the rear-side has rear-side contact structure;
wherein the rear-side contact structure comprises:
a plurality of electrically conductive contact fingers, which have a first metal;
a plurality of solder pads directly and laterally connected to the contact fingers,
wherein the solder pads have a top;
wherein the solder pads have a second metal, which is different from the first metal; and
several cell connectors electrically connected to the solder pads;
wherein the top of the solder pads is free from the contact fingers in an area along one direction; and
wherein the cell connectors are disposed planar on or above the area,
wherein the rear-side contact structure has several busbars electrically connected to the contact fingers, wherein at least one cell connector is disposed between two busbars.

2. The bifacial photovoltaic module of claim 1, wherein the contact fingers are disposed substantially perpendicular to the cell connectors.

3. The bifacial photovoltaic module of claim 1, wherein the busbars comprise the first metal.

4. The bifacial photovoltaic module of claim 1, wherein the busbars are disposed substantially parallel to the cell connectors.

5. The bifacial photovoltaic module of claim 1, wherein one busbar is disposed exactly in the middle between two cell connectors.

6. The bifacial photovoltaic module of claim 1, wherein the cell connectors electrically interconnect several solder pads.

7. The bifacial photovoltaic module of claim 1, wherein at least one contact finger is disposed between two solder pads.

8. The bifacial photovoltaic module of claim 1, wherein the area between the cell connectors and the rear-side is free from contact fingers.

9. The bifacial photovoltaic module of claim 1, wherein the area between the cell connectors and the rear-side is free from busbars.

10. The bifacial photovoltaic module of claim 3, wherein the contact fingers are electrically connected to at least one solder pad and/or at least one busbar.

11. The bifacial photovoltaic module of claim 1, wherein at least one part of the solder pads is laterally connected to the contact fingers or disposed on or under the contact fingers.

12. The bifacial photovoltaic module of claim 1, wherein the cell connectors are configured at least one of as a wire or as a strip.

13. The bifacial photovoltaic module of claim 1, wherein the solder pads are disposed in columns and rows;
wherein the arrangement is such that solder pads of adjacent columns are disposed respectively offset about a row.

14. The bifacial photovoltaic module of claim 1, wherein the top of the solder pads is free from the contact fingers, wherein the top of the solder pads is further free of any beads of the first metal from the contact fingers in the area on the top of the solder pads, and the cell connectors are disposed planar on or above this area.

15. The bifacial photovoltaic module of claim 1, wherein the plurality of solder pads are separate from the several busbars so as not to be directly connected with the busbars.

16. The bifacial photovoltaic module of claim 1, wherein the plurality of solder pads are directly on the rear side of the substrate.

17. The bifacial photovoltaic module of claim 1, wherein each of the plurality of solder pads are laterally connected to one or more of the contact fingers at one or more sides of the solder pads which are perpendicular to the top of the solder pad.

* * * * *

UNITED STATES PATENT AND TRADEMARK OFFICE
CERTIFICATE OF CORRECTION

PATENT NO. : 10,665,744 B2
APPLICATION NO. : 15/098346
DATED : May 26, 2020
INVENTOR(S) : Bernd Bitnar et al.

It is certified that error appears in the above-identified patent and that said Letters Patent is hereby corrected as shown below:

On the Title Page

Column 1, After Item (22) Please insert Item (30):
--(30) Foreign Application Priority Data
December 2, 2015 (DE)............20 2015 106 557.4--

Signed and Sealed this
Fifteenth Day of September, 2020

Andrei Iancu
*Director of the United States Patent and Trademark Office*